United States Patent
James et al.

(10) Patent No.: US 7,186,589 B2
(45) Date of Patent: Mar. 6, 2007

(54) METHOD FOR FABRICATING SEMICONDUCTOR COMPONENTS USING MOLD CAVITIES HAVING RUNNERS CONFIGURED TO MINIMIZE VENTING

(75) Inventors: Steven L. James, Boise, ID (US); William D. Tandy, deceased, late of Boise, ID (US); Lori Tandy, legal representative, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 298 days.

(21) Appl. No.: 10/949,612

(22) Filed: Sep. 24, 2004

(65) Prior Publication Data

US 2005/0035435 A1 Feb. 17, 2005

Related U.S. Application Data

(62) Division of application No. 09/944,323, filed on Aug. 30, 2001, now Pat. No. 6,969,918.

(51) Int. Cl.
*H01L 21/44* (2006.01)
*H01L 21/48* (2006.01)
*H01L 21/50* (2006.01)

(52) U.S. Cl. .................. 438/112; 438/111
(58) Field of Classification Search .......... 438/107, 438/110, 111, 112, 123, 124, 126, 127
See application file for complete search history.

(56) References Cited

U.S. PATENT DOCUMENTS

| 4,556,896 A | 12/1985 | Meddles |
| 5,550,711 A | 8/1996 | Burns et al. |
| 5,578,261 A | 11/1996 | Manzione et al. |
| 5,623,163 A | 4/1997 | Izumi |
| 5,665,281 A | 9/1997 | Drummond |
| 5,757,067 A * | 5/1998 | Inaba .................. 257/666 |
| 5,776,512 A | 7/1998 | Weber |
| 5,824,252 A | 10/1998 | Miyajima |
| 5,853,771 A | 12/1998 | Matsumoto |
| 5,971,734 A * | 10/1999 | Moon .................. 425/121 |
| 6,210,992 B1 | 4/2001 | Tandy et al. |
| 6,229,202 B1 | 5/2001 | Corisis |

(Continued)

FOREIGN PATENT DOCUMENTS

JP 354043470 A 4/1979

(Continued)

*Primary Examiner*—S. V. Clark
(74) *Attorney, Agent, or Firm*—Stephen A. Gratton

(57) ABSTRACT

A system for fabricating semiconductor components includes mating mold cavity plates having mold cavities configured to mold body segments of the semiconductor components on either side of a leadframe. The mold cavity plates also include runners configured to direct molding compound between the mold cavities and into the corners of the mold cavities. The runners prevent trapped air from accumulating in the corners of the mold cavities, and eliminate the need for air vents in the corners. The mold cavity plates also include dummy mold cavities configured to form dummy segments on the leadframe, and air vents in flow communication with the dummy segments. The dummy mold cavities are configured to collect trapped air, and to direct the trapped air through the air vents to atmosphere. Each dummy mold cavity has only a single associated air vent, such that cleaning is facilitated, and flash particles from the air vents are reduced. A method for fabricating semiconductor components includes a molding step performed using the system. A semiconductor component fabricated using the system includes the leadframe, a die, upper and lower body segments encapsulating the die, and dummy segments on the leadframe.

20 Claims, 12 Drawing Sheets

U.S. PATENT DOCUMENTS

| | | |
|---|---|---|
| 6,258,624 B1 | 7/2001 | Corisis |
| 6,309,916 B1 | 10/2001 | Crowley et al. |
| 6,329,829 B1 | 12/2001 | Farnworth et al. |
| 6,331,453 B1 | 12/2001 | Bolken et al. |
| 6,373,126 B1 | 4/2002 | Patel et al. |
| 6,383,846 B1 | 5/2002 | Shen et al. |
| 6,424,023 B1 * | 7/2002 | Kim et al. .................. 257/666 |
| 6,439,869 B1 | 8/2002 | Seng et al. |
| 6,521,980 B1 | 2/2003 | Tandy et al. |
| 6,523,254 B1 | 2/2003 | Street et al. |
| 6,537,051 B2 | 3/2003 | Tandy |
| 6,626,656 B2 | 9/2003 | Thummel |
| 6,638,595 B2 | 10/2003 | Rumsey et al. |
| 6,644,949 B2 | 11/2003 | Rumsey et al. |
| 6,645,792 B2 | 11/2003 | Oga et al. |
| 6,652,799 B2 | 11/2003 | Seng et al. |
| 6,656,769 B2 | 12/2003 | Tim et al. |
| 6,660,558 B1 | 12/2003 | Bolken et al. |
| 6,670,220 B2 | 12/2003 | Sakuraba et al. |
| 6,724,072 B2 | 4/2004 | Ochiai et al. |
| 6,773,247 B1 * | 8/2004 | Osada et al. .................. 425/89 |
| 6,800,507 B2 * | 10/2004 | Kasuga et al. .............. 438/112 |
| 6,969,918 B1 | 11/2005 | James et al. |
| 7,005,025 B2 | 2/2006 | Summers |
| 2002/0012716 A1 | 1/2002 | Mishima et al. |
| 2002/0024126 A1 | 2/2002 | Hauser et al. |
| 2002/0025353 A1 | 2/2002 | Williams |
| 2002/0033523 A1 | 3/2002 | Cigada et al. |
| 2002/0043389 A1 | 4/2002 | Murugan |
| 2002/0043721 A1 | 4/2002 | Weber |
| 2002/0051832 A1 | 5/2002 | Abela et al. |
| 2002/0057553 A1 | 5/2002 | Jeon et al. |
| 2002/0115237 A1 | 8/2002 | Williams |
| 2002/0186549 A1 | 12/2002 | Bolken |
| 2003/0034568 A1 | 2/2003 | Chai et al. |
| 2003/0122279 A1 | 7/2003 | Tsuruta |
| 2003/0178748 A1 | 9/2003 | Bolken et al. |
| 2004/0011699 A1 | 1/2004 | Park |
| 2004/0046267 A1 | 3/2004 | Huang |
| 2004/0150082 A1 | 8/2004 | Kajwara et al. |
| 2005/0022378 A1 | 2/2005 | Bolken et al. |
| 2005/0133159 A1 | 6/2005 | Johnsgard et al. |

FOREIGN PATENT DOCUMENTS

| | | |
|---|---|---|
| JP | 356002641 A | 1/1981 |
| JP | 355022873 A | 2/1982 |
| JP | 358017646 A | 2/1983 |
| JP | 11-179763 | 7/1999 |

* cited by examiner

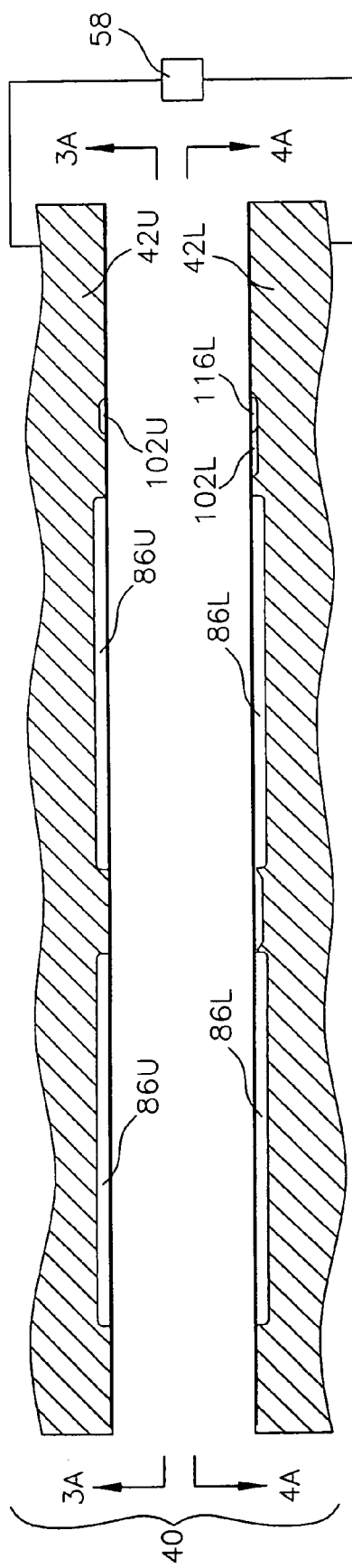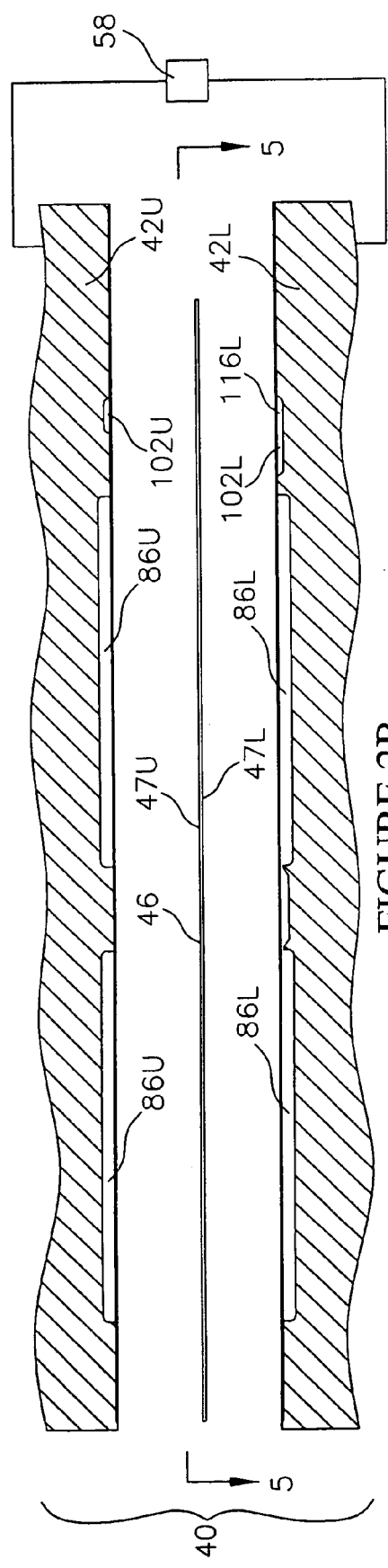
FIGURE 2A
FIGURE 2B

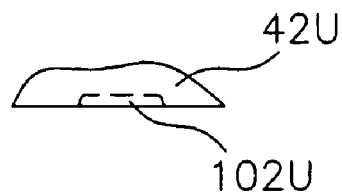
FIGURE 3G
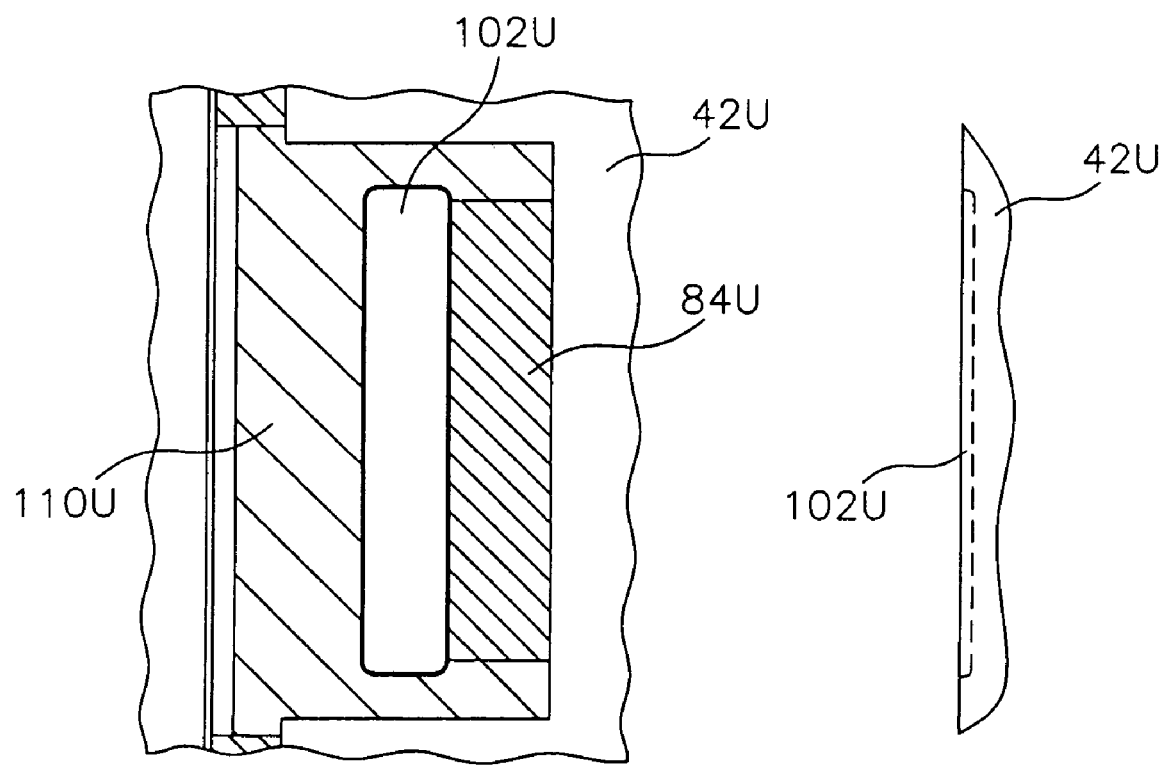
FIGURE 3E
FIGURE 3F

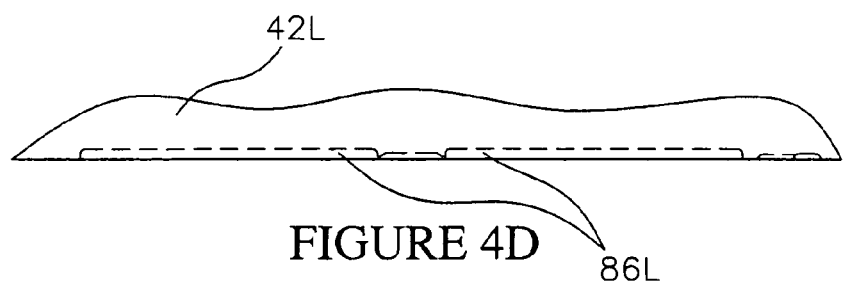
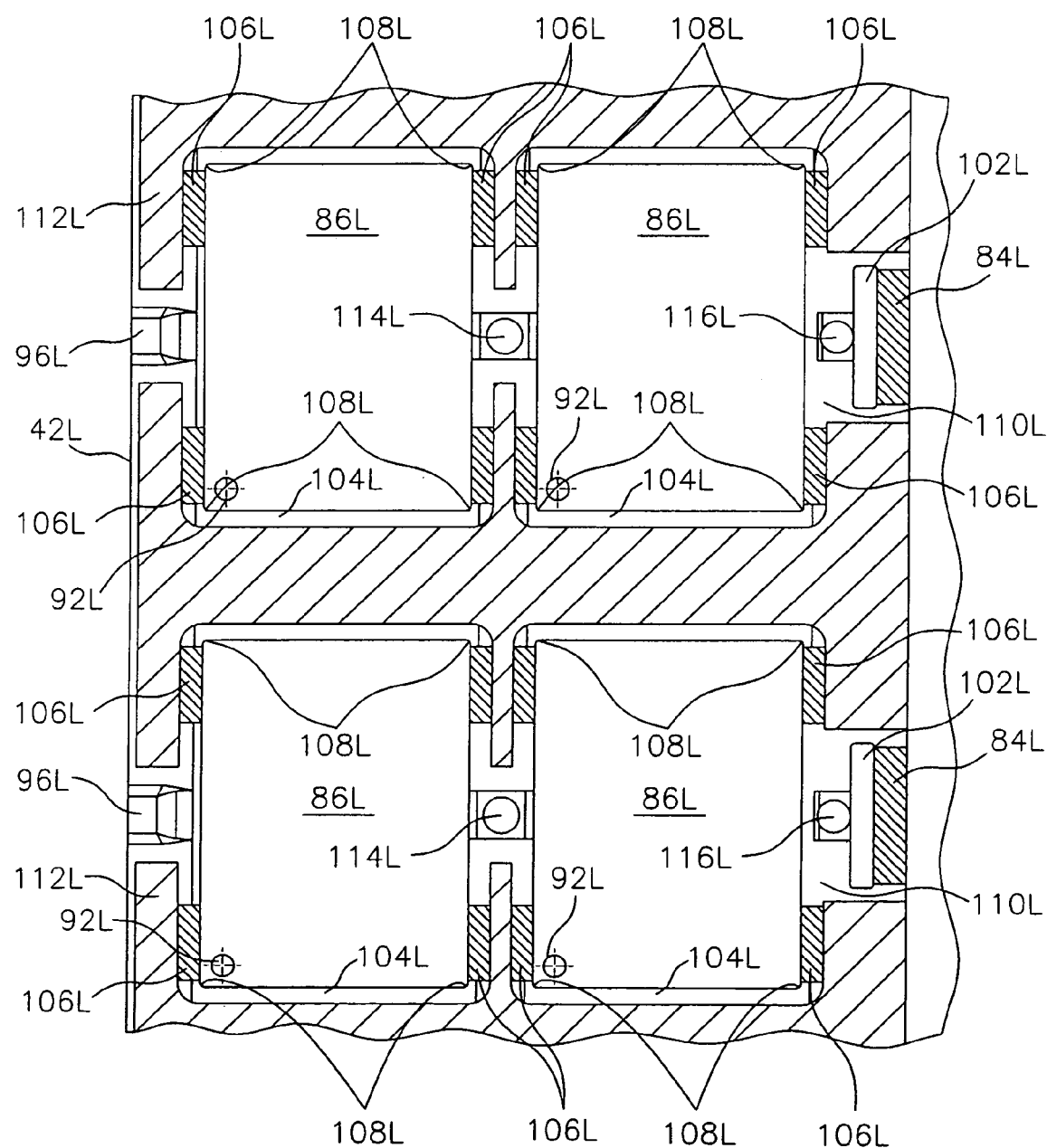

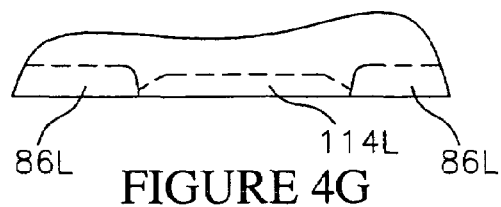
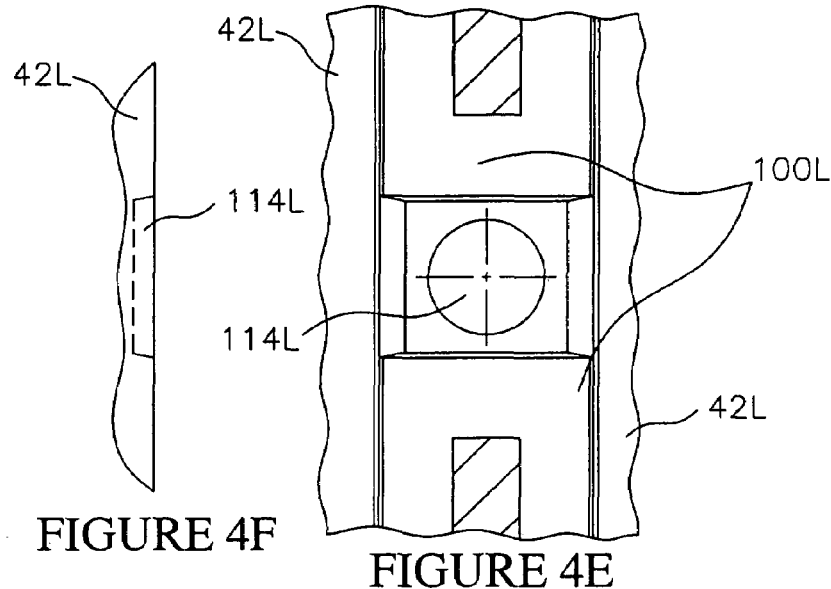
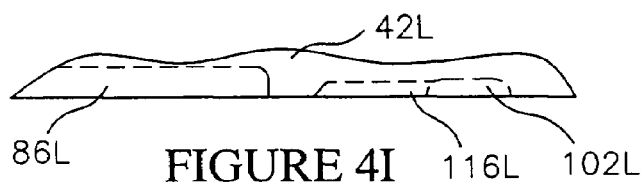
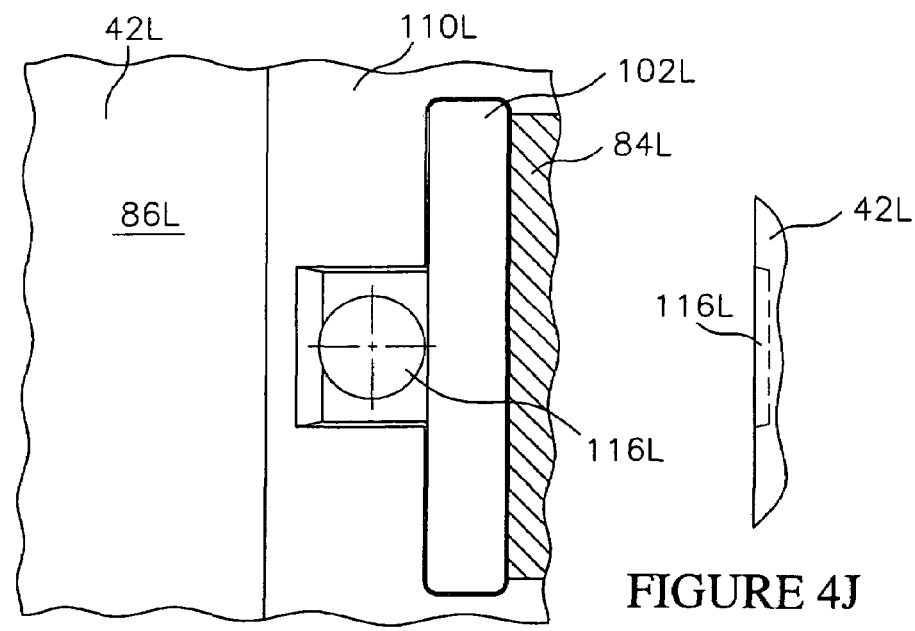

METHOD FOR FABRICATING SEMICONDUCTOR COMPONENTS USING MOLD CAVITIES HAVING RUNNERS CONFIGURED TO MINIMIZE VENTING

CROSS REFERENCE TO RELATED APPLICAIONS

This application is a division of Ser. No. 09/944,323, filed Aug. 30, 2001, U.S. Pat. No. 6,969,918.

This application is related to Ser. No. 10/949,904, filed Sep. 24, 2004.

FIELD OF THE INVENTION

This invention relates generally to semiconductor packaging. More particularly, this invention relates to a system and to a method for fabricating semiconductor packages using mold cavities having runners configured to minimize venting.

BACKGROUND OF THE INVENTION

Semiconductor packages typically include a semiconductor die encapsulated in a molded plastic body. The molded plastic body rigidifies and protects the die from the environment. Semiconductor packages also include a substrate, such as a leadframe, or a circuit board material, on which the die is mounted. The substrate includes conductors such as lead fingers for a leadframe, or conductive traces for a circuit board substrate which provide internal signal, power and ground paths through the package body to the die. The package also includes terminal contacts, such a metal leads, or solder balls, for making electrical connections from the outside to the package.

The molded plastic body can be formed using a transfer molding process. During this process a mold cavity is placed on the substrate and over the die, and a molding compound, such as an epoxy resin, is injected into the mold cavity. The molding compound can be injected on either side of the substrate to encapsulate the die and associated wire bonds.

A prior art transfer molding process is illustrated in FIG. 1. In this example the substrate comprises a metal leadframe 10. FIG. 1 illustrates only a portion of the leadframe 10, which includes multiple semiconductor dice 12 mounted in pairs across the width of the leadframe 10. The leadframe 10 is an elongated member configured to fabricate multiple semiconductor packages 14. Each package 14 includes a molded plastic body 28 which encapsulates a die 12, and opposing surfaces on a portion of the leadframe 10.

The leadframe 10 includes openings 16A, 16B, 16C along longitudinal edges thereof, which facilitate handling by automated equipment such as conveyor tracks, magazines and loaders. The openings 16A, 16B, 16C also function to align the leadframe 10 on various process systems such as die attachers, wire bonders, molding systems, and singulation systems. The leadframe 10 also includes transverse thermal expansion slots 18 and leadfingers 20 that are wire bonded to bond pads (not shown) on the dice 12. The leadfingers 20 are connected by bus bars 22, and will subsequently be trimmed and formed into the terminal leads for the packages 14. Further, the leadframe 10 includes a molding slot 24 which facilitates the flow of a molding compound 26 during molding of the plastic bodies 28.

As illustrated by the flow arrows 30, during the molding process the molding compound 26 is injected across the width of the leadframe 10 from left to right in FIG. 1. A system for performing the molding process includes mold cavities (not shown) clamped to the opposing surfaces of the leadframe 10. During the molding process, trapped air bubbles 36 in the molding compound 26 can be released to a dummy mold cavity (not shown) which forms dummy segments 38 on the opposing surfaces of the leadframe 10. However, some of the air is trapped at the corners of the mold cavities, proximate to the corners 32 of the molded plastic bodies 28. The trapped air requires that the molding system includes air vents 34 (indicated by dotted lines) in flow communication with the mold cavities proximate to the corners 32 of the molded plastic bodies 30.

One problem with the prior art molding system is that the air vents 34 will typically fill with molding compound 26 during normal production. At given intervals the air vents 34 must be cleaned, which requires that any molding compound 26, and also any cleaning compound in the air vents 34, be scrapped out and removed. In view of the large number of air vents 34 in a molding system and their small size, the cleaning process takes time, and adversely affects the productivity of the molding system.

Another problem with the air vents 34 is the excess molding compound which forms in the air vents 34. This excess molding compound is sometimes referred to as mold "flash". The flash fills the air vents 34 causing blockage and defective packages 14. In addition, small pieces of flash can break loose from the air vents and stick to the leadframe 10. The pieces of flash can cause shorting in the completed packages 14, and can also accumulate on various process equipment, such as conveyor tracks, causing additional problems. Often times the flash pieces are charged such that they are attracted to metal surfaces.

The present invention is directed to a system and to a method for molding semiconductor components in which additional runners are employed to channel the molding compound through corners of the mold cavities that must normally be vented. This eliminates a large number of air vents, and alleviates the cleaning and flash accumulation problems associated with the air vents.

SUMMARY OF THE INVENTION

In accordance with the present invention, an improved system for fabricating semiconductor components, an improved method for fabricating semiconductor components, and improved semiconductor components fabricated using the system and the method are provided.

In an illustrative embodiment, the system and the method are used to fabricate plastic semiconductor packages on a metal leadframe. The leadframe is configured to support semiconductor dice in pairs two abreast for molding. In addition, the leadframe includes leadfingers wire bonded to the dice, and configured to form the internal and external leads for the packages.

The system includes an upper mold cavity plate having a plurality of upper mold cavities, and a lower mold cavity plate having a plurality of lower mold cavities. The upper mold cavity and the lower mold cavity are configured to engage opposing surfaces of the leadframe, and to mold the plastic packages onto the leadframe. In addition, each mold cavity plate includes corner runners configured to channel molding compound through the corners of the mold cavities, and into dummy cavities on opposing surfaces of the leadframe. The flow of molding compound through the corners prevents trapped air from accumulating in the corners. Each dummy cavity is in flow communication with a single air vent, and any trapped air in the molding compound is channeled through the dummy mold cavities and into the air vents. The runners eliminate the corner air vents of the prior art molding system such that there are fewer air vents to clean and less flash particles are produced.

The method includes the step of providing the upper mold cavity and the lower mold cavity with the mold cavities, the runners, the dummy cavities and the air vents. The method also includes the steps of injecting the molding compound into the mold cavities, and directing the molding compound proximate to the corners of the mold cavities using the runners. In addition, the method includes the step of directing trapped air through the runners into the dummy mold cavities, and then out the air vents.

Each semiconductor package includes a semiconductor die, and upper and lower body segments encapsulating the die and a portion of the leadframe. Prior to singulation of the packages, the leadframe includes upper dummy segments and lower dummy segments on upper and lower surfaces thereof proximate to an edge of the leadframe. The leadframe also includes a connecting dummy segment on the lower surface thereof between adjacent pairs of packages. In addition, the leadframe includes second dummy segments on the lower surface thereof connected to the lower dummy segments.

BRIEF DESCRIPTION OF THE DRAWINGS

FIGS. 2A–2D are schematic cross sectional views illustrating a system constructed in accordance with the invention, and steps in a method for fabricating semiconductor packages in accordance with the invention;

FIG. 3E is an enlarged view of a portion of the upper mold cavity plate taken along dotted segment 3E of FIG. 3A illustrating a dummy mold cavity on the upper mold cavity plate;

FIG. 3F is a side elevation view of the dummy mold cavity;

FIG. 3G is an end view of the dummy mold cavity;

FIG. 4C is an enlarged view of a portion of the lower mold cavity plate taken along dotted segment 4C of FIG. 4A illustrating lower mold cavities on the lower mold cavity plate;

FIG. 4D is a side elevation view of a lower mold cavity;

FIG. 4E is an enlarged view of a portion of the lower mold cavity plate taken along dotted segment 4E of FIG. 4C illustrating a connecting dummy cavity on the lower mold cavity plate;

FIG. 4F is a side elevation view of the connecting dummy cavity;

FIG. 4G is an end elevation view of the connecting dummy cavity;

FIG. 4H is an enlarged view of a portion of the lower mold cavity plate taken along dotted segment 4H of FIG. 4C illustrating a dummy mold cavity on the lower mold cavity plate;

FIG. 4I is an end elevation view of the dummy mold cavity;

FIG. 4J is a side elevation view of the dummy mold cavity;

DETAILED DESCRIPTION OF THE PREFERRED EMBODIMENTS

Referring to FIGS. 2A–2D, a system 40 for fabricating semiconductor components, and steps in a method for fabricating the semiconductor components using the system 40 are illustrated. In the illustrative embodiment, the components comprise semiconductor packages 52 (FIG. 2D) having a TSOP (thin small outline package) configuration. However, it is to be understood that the system 40, and the method, can be used to fabricate other types of semiconductor components, such as chip scale packages, BGA devices, multi chip modules and other types of plastic packages (e.g., DIPs, SIPs etc.).

Referring to FIG. 2A, the system 40 includes a transfer molding apparatus 58. One suitable transfer molding apparatus 58 is manufactured by ASAHI Engineering Company of Japan and is designated a "COSMO" model.

Figure 2C:
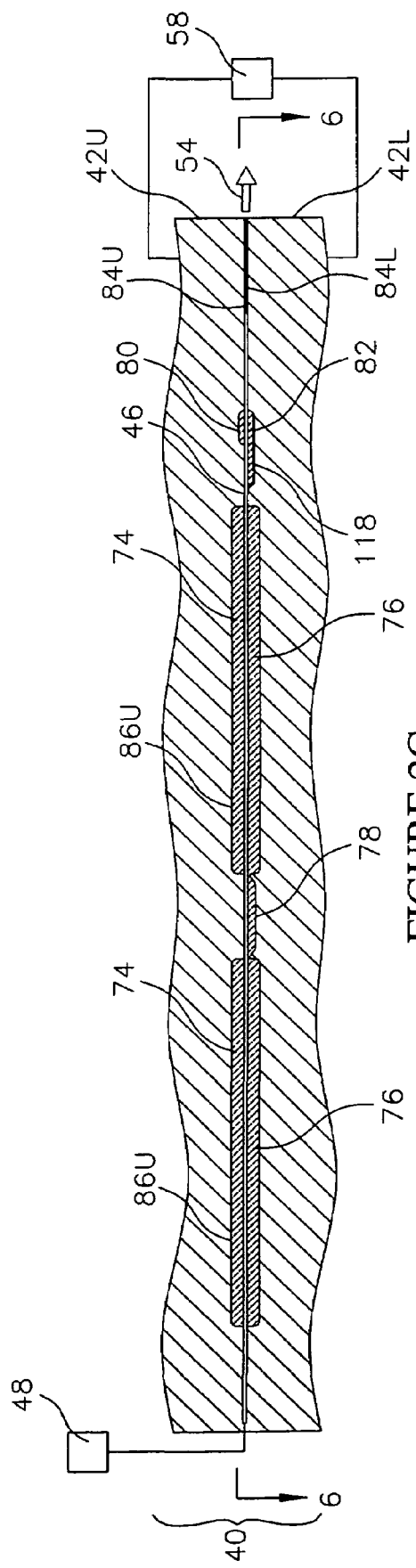

The system 40 also includes an upper mold cavity plate 42U, and a lower mold cavity plate 42L. The upper mold cavity plate 42U and the lower mold cavity plate 42L are movable by the transfer molding apparatus 58 between an open position (FIG. 2A), and a closed position (FIG. 2C). However, as is apparent the "upper" and "lower" terminology is for illustrative purposes, and would change according to the orientation of the system 40. Accordingly, the claims to follow refer generically to "a first mold cavity plate" (i.e., upper mold cavity plate 42U) and to "a second mold cavity plate" (i.e., lower mold cavity plate 42L).

Referring to FIG. 2B, for performing a molding step of the method, a leadframe 46 is placed between the upper mold cavity plate 42U and the lower mold cavity plate 42L. The transfer molding apparatus 58 can include suitable mechanisms (not shown) for placing and aligning the leadframe 46 between the mold cavity plates 42U, 42L. However, prior to the molding step, a plurality of semiconductor dice 56 (FIG. 5) are attached to the leadframe 46. The leadframe 46 includes an upper surface 47U on which the dice are mounted, and a lower surface 47L. In addition, as shown in FIG. 5, the leadframe 46 includes a plurality of lead fingers 60, and the dice 56 are wire bonded to the lead fingers 60.

The leadframe 46 can also include a plurality of mounting paddles (not shown) for supporting the dice 56.

Figure 5:
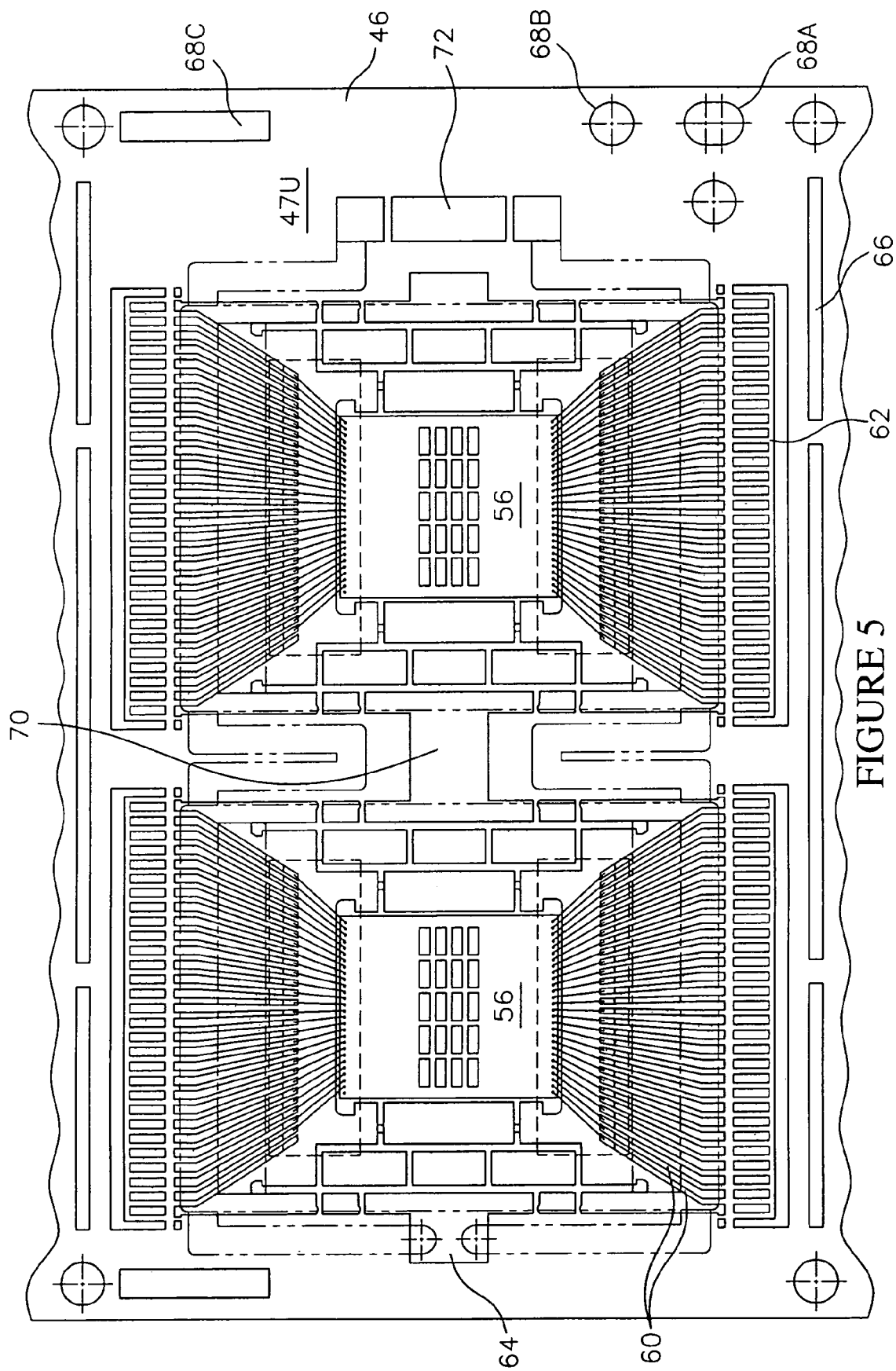
FIG. 5 is an enlarged plan view taken along line 5—5 of FIG. 2B illustrating a leadframe configured for constructing packages in accordance with the invention.

As shown in FIG. 5, the lead fingers 60 are initially connected by a bus bar 62, but following a trim and form step, will become the external leads for the semiconductor packages 52. As also shown in FIG. 5, the leadframe 46 includes handling openings 68A, 68B, 68C, and thermal expansion slots 66 that function substantially as previously described. In addition, the leadframe 46 includes mold inlet openings 64, connecting segment openings 70, and dummy segment openings 72 configured to facilitate the flow of the molding compound 50 and the formation of the molded features on the leadframe 46.

Referring to FIG. 2C, during the molding step, the upper mold cavity plate 42U and the lower mold cavity plate 42L are clamped by the transfer molding apparatus 58 to the upper surface 47U and the lower surface 47L of the leadframe 46. As also shown in FIG. 2C, the system 40 includes a molding compound source 48 configured to inject a molding compound 50 (FIG. 6) under pressure between the upper mold cavity plate 42U and the lower mold cavity plate 42L. The flow of the molding compound 50 (FIG. 6) during the molding step will be more fully explained as the description proceeds. Also during the molding step, air is vented from the upper mold cavity plate 42U and the lower mold cavity plate 42L through upper air vents 84U, and lower air vents 84L as indicated by air flow arrow 54. Although there are a plurality of air vents 84U, 84L, a single upper air vent 84U and a single lower air vent 84L is associated with each pair of packages 52 on the leadframe 46.

Figure 2D:
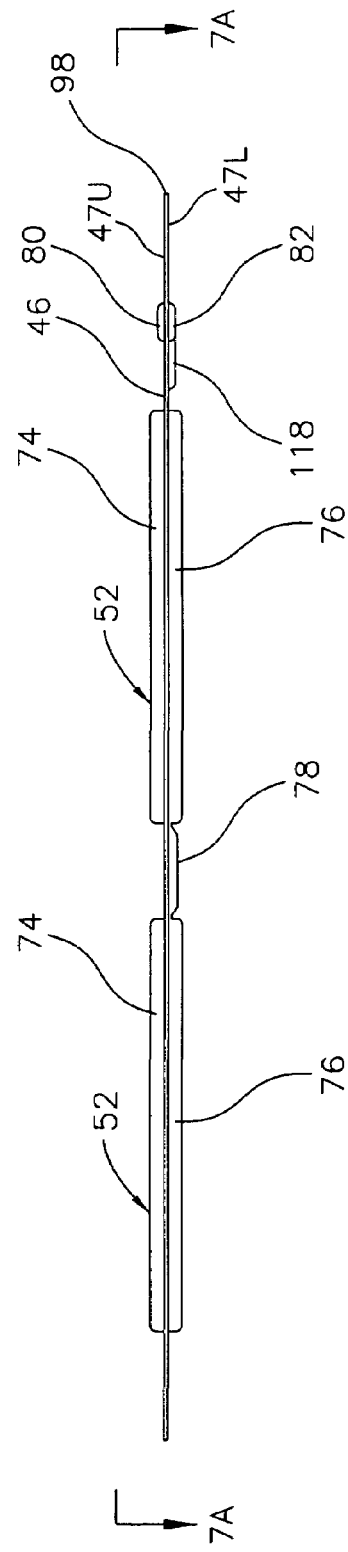
Figure 7B:
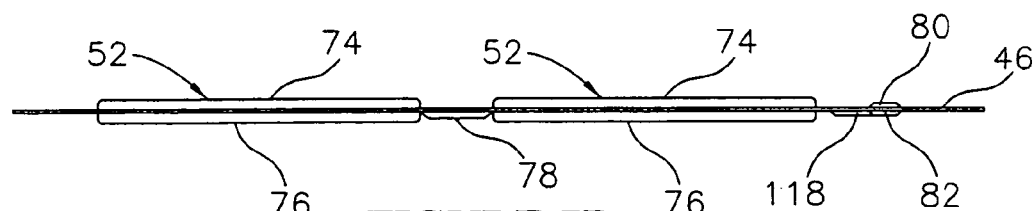
FIG. 7B is a side elevation view of the semiconductor packages on the leadframe.
Figure 7A:
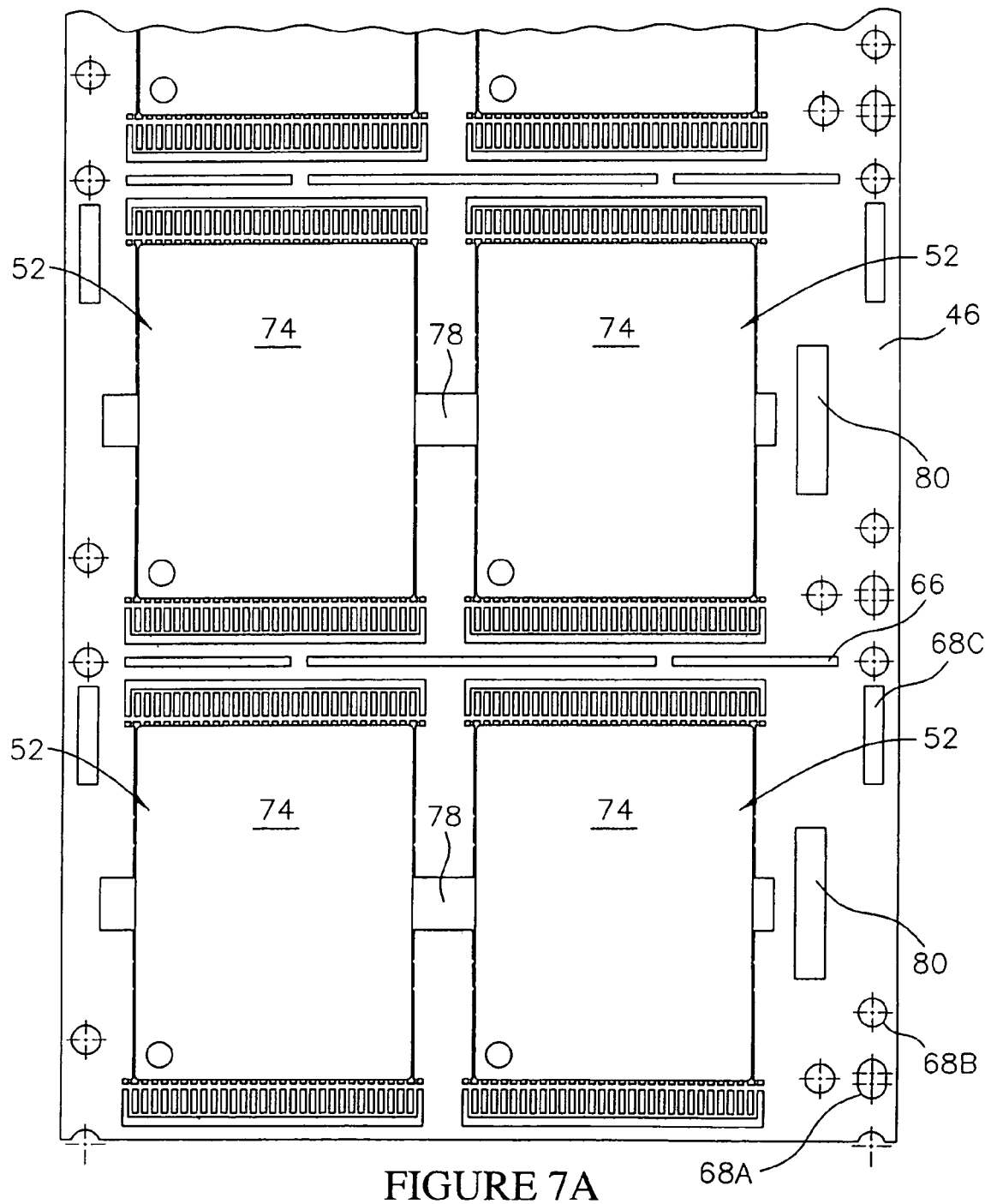
FIG. 7A is a plan view taken along line 7A—7A of FIG. 2D illustrating semiconductor packages on the leadframe constructed using the system and method of the invention.

Referring to FIG. 2D, following the molding step the leadframe 46 includes a plurality of semiconductor packages 52. The leadframe 46 with the semiconductor packages 52 thereon is also shown in FIGS. 7A and 7B. Each semiconductor package 52 includes an upper body segment 74 and a lower body segment 76, having matching thicknesses and peripheral outlines. However, it is to be understood that the invention can also be practiced to form a molded body segment on only one side of a semiconductor component, or to form a component having asymmetrical molded body segments.

As also shown in FIG. 2D, the leadframe 46 includes upper dummy segments 80 and lower dummy segments 82 located proximate to a right lateral edge 98 of the leadframe 46. In addition, the leadframe 46 includes connecting dummy segments 78 located between adjacent semiconductor packages 52. The structure and function of the dummy segments 78, 80, 82 will be more fully explained as the description proceeds.

Figures 3A, 3B:
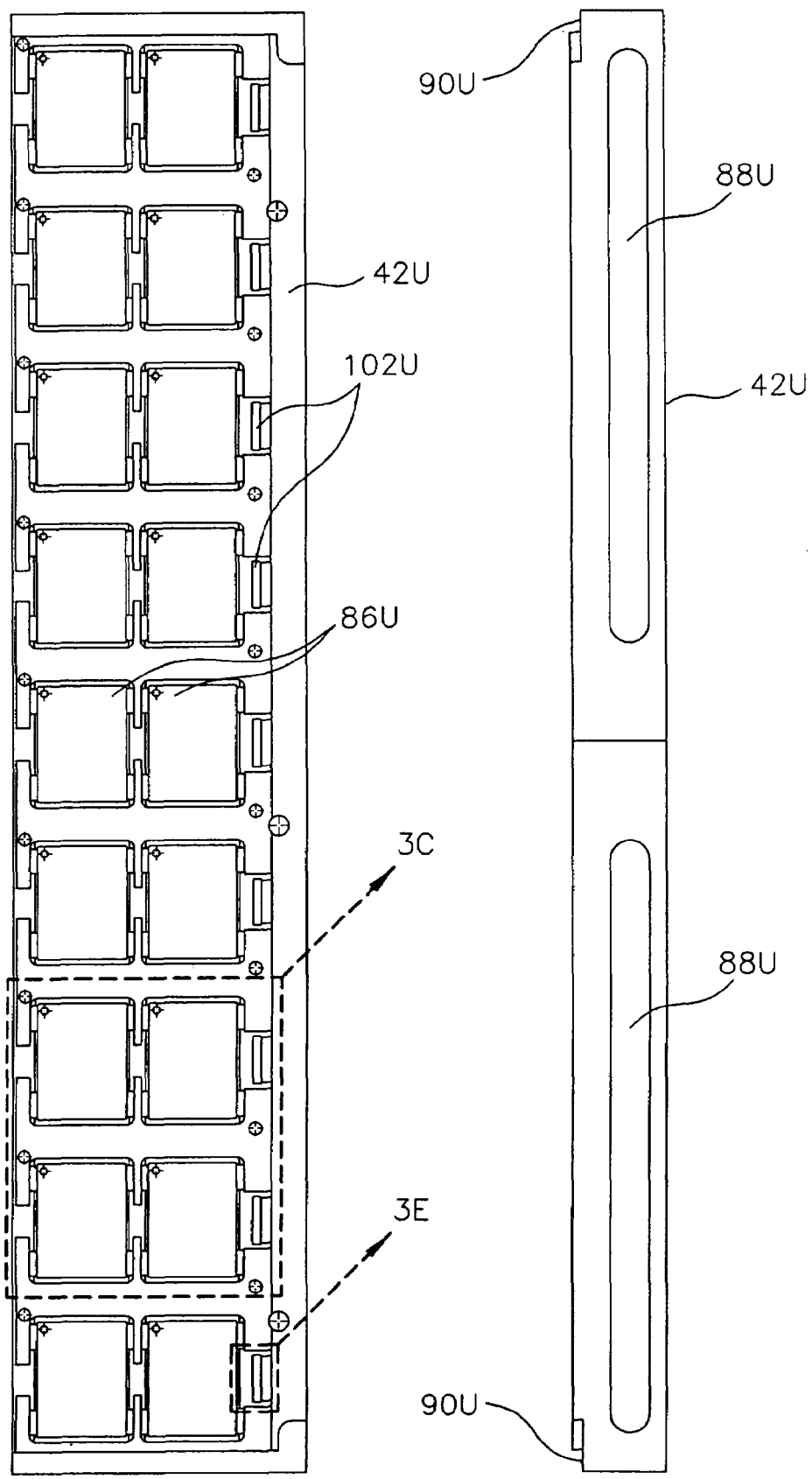
FIG. 3A is a bottom view of an upper mold cavity plate of the system taken along line 3A—3A of FIG. 2A.
FIG. 3B is a side elevation view of the upper mold cavity plate.

Referring to FIGS. 3A–3D, the upper mold cavity plate 42U is illustrated. The upper mold cavity plate 42U is preferably machined out of a single block of a metal, such as stainless steel. As shown in FIG. 3A, the upper mold cavity plate 42U has a generally rectangular peripheral shape which corresponds to, but is slightly larger than the rectangular peripheral shape of the leadframe 46.

As also shown in FIG. 3A, the upper mold cavity plate 42U includes a plurality of upper mold cavities 86U, which are arranged in pairs corresponding to the locations of the semiconductor dice 56 (FIG. 5) on the leadframe 46. The upper mold cavities 86U are configured to mold the upper body segments 74 (FIG. 2D) of the packages 52 (FIG. 2D). The upper mold cavity plate 42U also includes upper dummy mold cavities 102U configured to mold the upper dummy segments 80 (FIG. 2D) on the leadframe 46.

As shown in FIG. 3B, the upper mold cavity plate 42U also includes handling recesses 88U on opposing sides thereof. In addition the upper mold cavity plate 42U includes stepped surfaces 90U on opposing ends thereof.

Figure 3D:
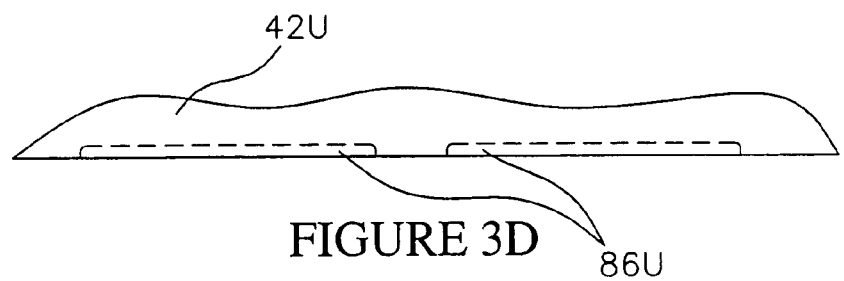
FIG. 3D is a side elevation view of the upper mold cavities.
Figure 3C:
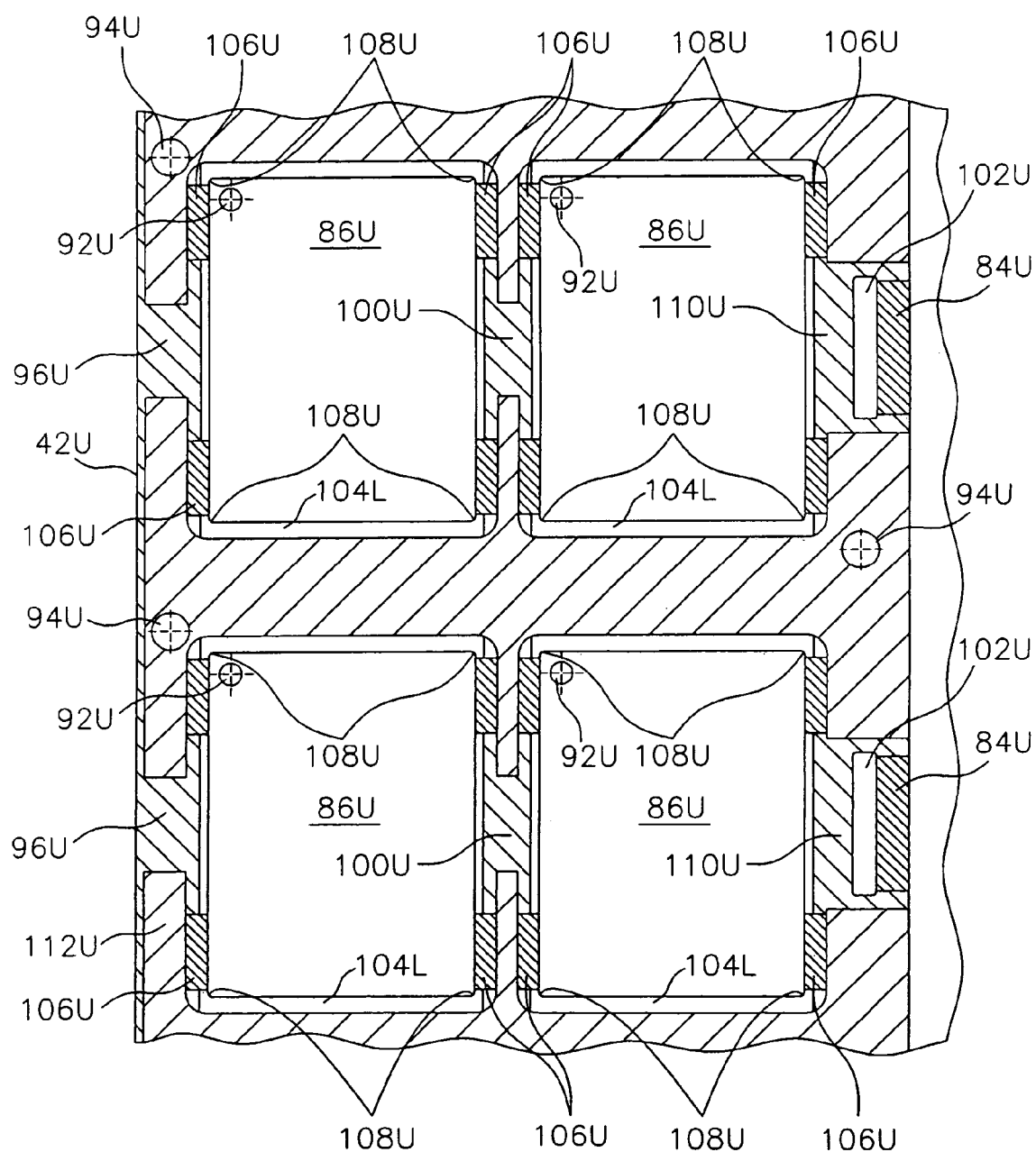
FIG. 3C is an enlarged view of a portion of the upper mold cavity plate taken along dotted segment 3C of FIG. 3A illustrating upper mold cavities on the upper mold cavity plate.
Figures 4A, 4B:
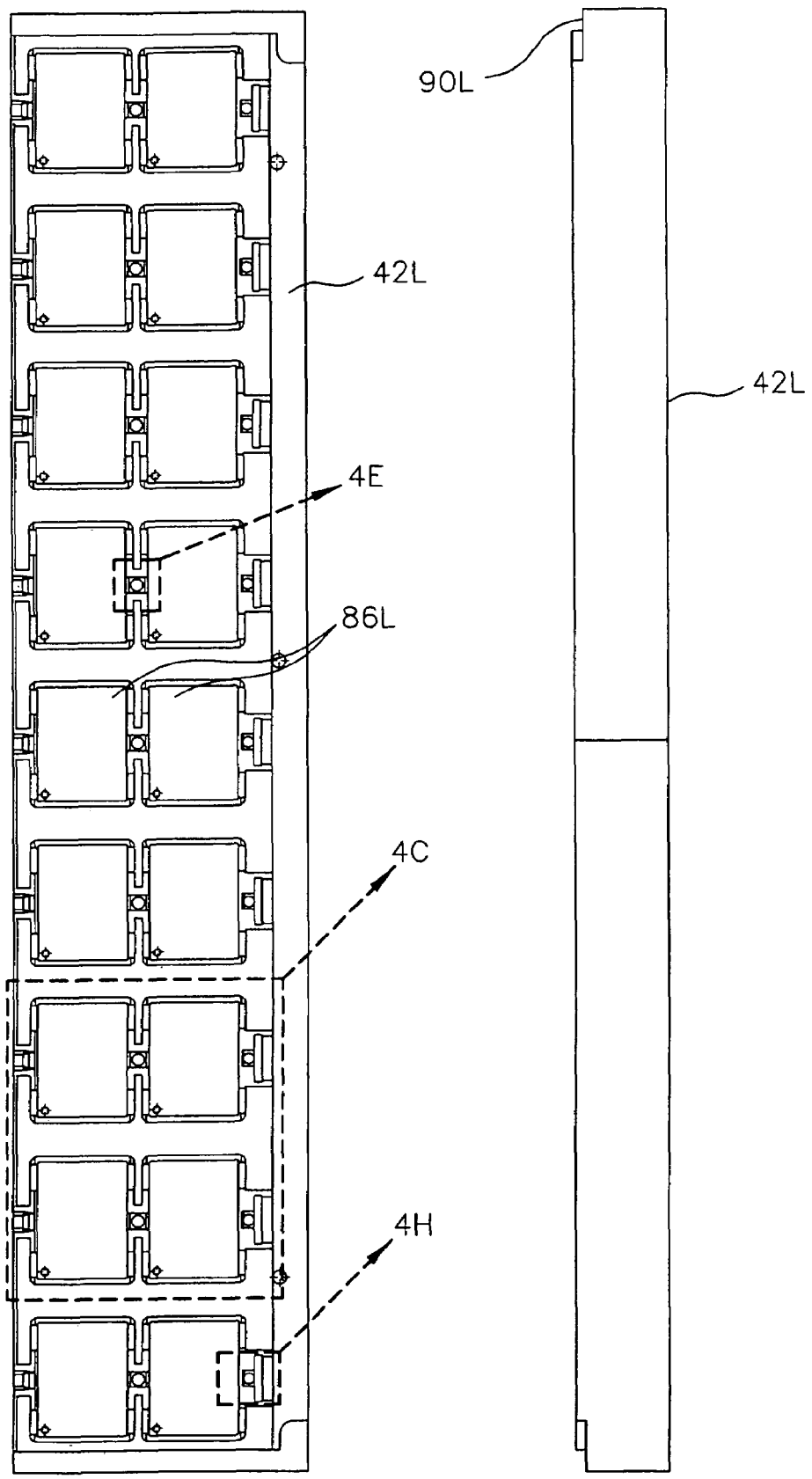
FIG. 4A is a plan view of a lower mold cavity plate of the system taken along line 4A—4A of FIG. 2A.
FIG. 4B is a side elevation view of the lower mold cavity plate.

As shown in FIG. 3C, the upper mold cavity plate 42U also includes openings 92U in the upper mold cavities 86U configured to receive knockout pins for pushing the semiconductor packages 52 (FIG. 2D) out of the upper mold cavities 86U. In addition, the upper mold cavity plate 42U includes through holed openings 94U configured to for use with associated ejector pins for ejecting the leadframe 46.

Figure 1:
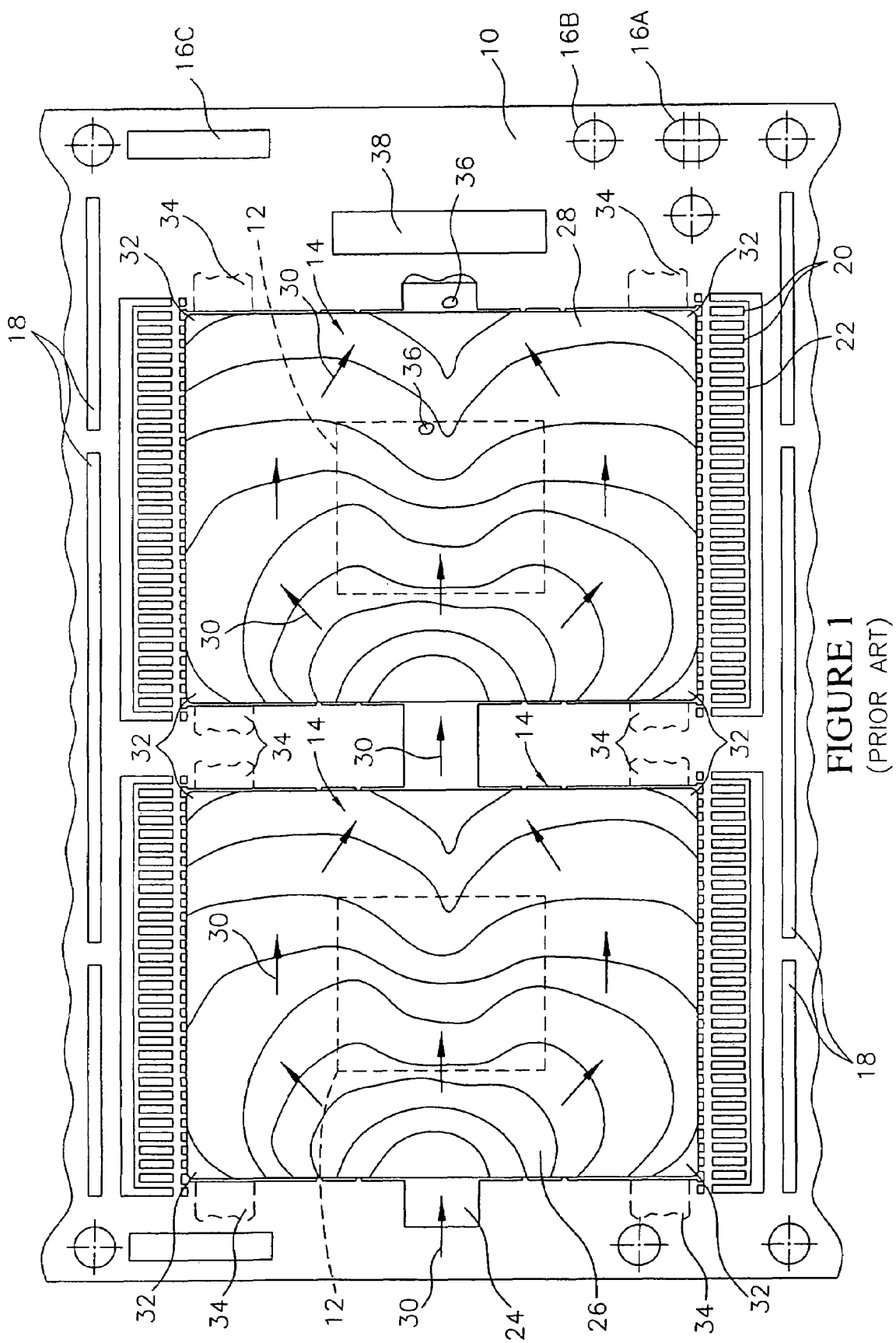
FIG. 1 is a schematic cross sectional view illustrating a prior art method for molding a semiconductor package using multiple vents located proximate to the corners of the package.

As also shown in FIG. 3C, the upper mold cavity plate 42U includes inlet runners 96U configured to receive the molding compound 50 (FIG. 6) from the molding compound source 48 (FIG. 2C), and to direct the molding compound 50 into the upper mold cavities 86U. In addition, the upper mold cavity plate 42U includes connecting runners 100U configured to direct the molding compound 50 between adjacent pairs of upper mold cavities 86U. Further, the upper mold cavity plate 42U includes corner runners 106U configured to direct the molding compound 50 into the corners 108U of the upper mold cavities 86U. As will be further explained, the corner runners 106U prevent air from being trapped in the corners 108U of the upper mold cavities 86U, and allow the air vents 34 (FIG. 1) of the prior art system to be eliminated. In addition, the corner runners 106 improve the construction of the packages 52 because the corners thereof do not include trapped air.

As shown in FIG. 3C, the upper mold cavity plate 42U also includes dummy runners 110U configured to direct the molding compound 50 from the upper mold cavities 86U into the dummy cavities 102U. In addition, the upper mold cavity plate 42U includes the upper air vents 84U configured to vent air from the dummy mold cavities 102U to atmosphere. Each pair of upper mold cavities 86U has a single upper air vent 84U associated therewith. However, all of the air vents 84U are in flow communication and vent to atmosphere.

During the molding step, the inlet runners 96U, the corner runners 106U, the connecting runners 100U, and the dummy runners 110U, in combination with the upper surface 47U (FIG. 2B) of the leadframe 46, form closed conduits for channeling the flow of the molding compound 50 over the upper surface 47U of the leadframe 46.

Still referring to FIG. 3C, the upper mold cavities 86U include peripheral lips 104U which are also known as "clamping surfaces" which are configured to engage the upper surface 47U of the lead frame 46. The peripheral lips 104L are the highest surfaces on the upper mold cavity plate 42U and sealingly engage the upper surface 47U of the lead frame 46 for forming the upper body segments 74 of the packages 52. In addition, the peripheral lips 104U space the runners 96U, 106U, 100U, 110U from the upper surface 47U of the leadframe 46 such that the molding compound 50 can flow between the runners 96U, 106U, 100U, 110U and the upper surface 47U of the leadframe 46.

One method for fabricating the peripheral lips 104L is to EDM (electric discharge machine) the cross hatched area 112U which surrounds the peripheral lips 104L to a selected depth. By way of example, this cross hatched area 112U can be EDMed to a depth measured from the surfaces of the peripheral lips 104L of about 1.01 to 1.78 mm. Similarly, the inlet runners 96U, the corner runners 106U, the connecting runners 100U, the dummy runners 110U and the air vents 84U can be EDMed to selected depths with respect to the surfaces of the peripheral lips 104L. By way of example, the depth of the inlet runners 96U, the connecting runners 100U and the dummy runners 110U can be about 0.005–0.008 mm. The depth of the corner runners 106U and the air vents 84U can be about 0.025 mm. In FIG. 3C, areas that have the same depth are cross hatched with the same section lines.

FIG. 3D illustrates the depth of the upper mold cavities 86U which is about 10 times greater than the depths of the runners 96U, 106U, 100U, 110U listed above. Accordingly, for simplicity FIG. 3D does not illustrate the depth of the runners 96U, 106U, 100U, 110U or the height of the peripheral lips 104U relative to the runners. By way of example, the upper mold cavities 86U can be EDMed to a depth of about 0.445 mm. In addition, the upper mold cavities 86U can have a length of about 18.40 mm and a width of about 14.000 mm. The inlet runners 96U can have a width of about 5.00 mm. The corner runners 106U can have a length of about 4.00 mm, and a width of about 0.8 mm. The peripheral lips 104U can have a width of about 0.8 mm.

Referring to FIGS. 3E–3G, a dummy mold cavity 102U and associated air vent 84U are illustrated. The dummy mold cavities 102U can have a depth of about 0.445 mm, a length of about 7.20 mm and a width of about 1.30 mm. However, as is apparent, all of the dimensions given above are merely exemplary, and can be adjusted as required by the skilled artisan.

Referring to FIGS. 4A–4I, the lower mold cavity plate 42L is shown. The lower mold cavity plate 42L is constructed substantially in a mirror image of the upper mold cavity plate 42U. In addition, the lower mold cavity plate 42L has the same size and shape as the upper mold cavity plate 42U includes the same stepped surfaces 90L as opposing ends. In addition, the lower mold cavity plate 42L includes lower mold cavities 86L having peripheral lips 104L (FIG. 4C) configured to sealingly engage the lower surface 47L of the leadframe 46. The lower mold cavities 86L and the upper mold cavities 86U form enclosed spaces which substantially determine the size and shape of the semiconductor packages 52 (FIG. 2D). The peripheral lips 104U of the lower mold cavities 86L are defined by EDMed surface 112L. The lower mold cavity plate 42L also includes openings 92L for knock out pins.

The lower mold cavity plate 42L also includes inlet runners 96L, corner runners 106L, connecting runners 106L, dummy runners 110L, dummy mold cavities 102L and air vents 84L. These elements are constructed substantially as mirror images of the equivalent elements contained on the upper mold cavity plate 42U. However, there are some differences between these elements. Specifically, as shown in FIG. 4C, the inlet runners 96L include faceted surfaces.

In addition, as shown in FIGS. 4E–4G, the connecting runners 100L include a connecting dummy cavity 114L, configured to form the connecting dummy segment 78 (FIG. 2D) between the packages 52. As shown in FIG. 4E, the connecting dummy cavity 114L is generally circular in shape with faceted surrounding surfaces. Further, as shown in FIGS. 4H–4I, the dummy runners 110L include a second dummy cavity 116L configured to form a second lower dummy segment 118 (FIG. 2D) on the leadframe 46. As shown in FIG. 4H, the second dummy cavity 116L is generally circular in shape with faceted surrounding surfaces.

Figure 6:
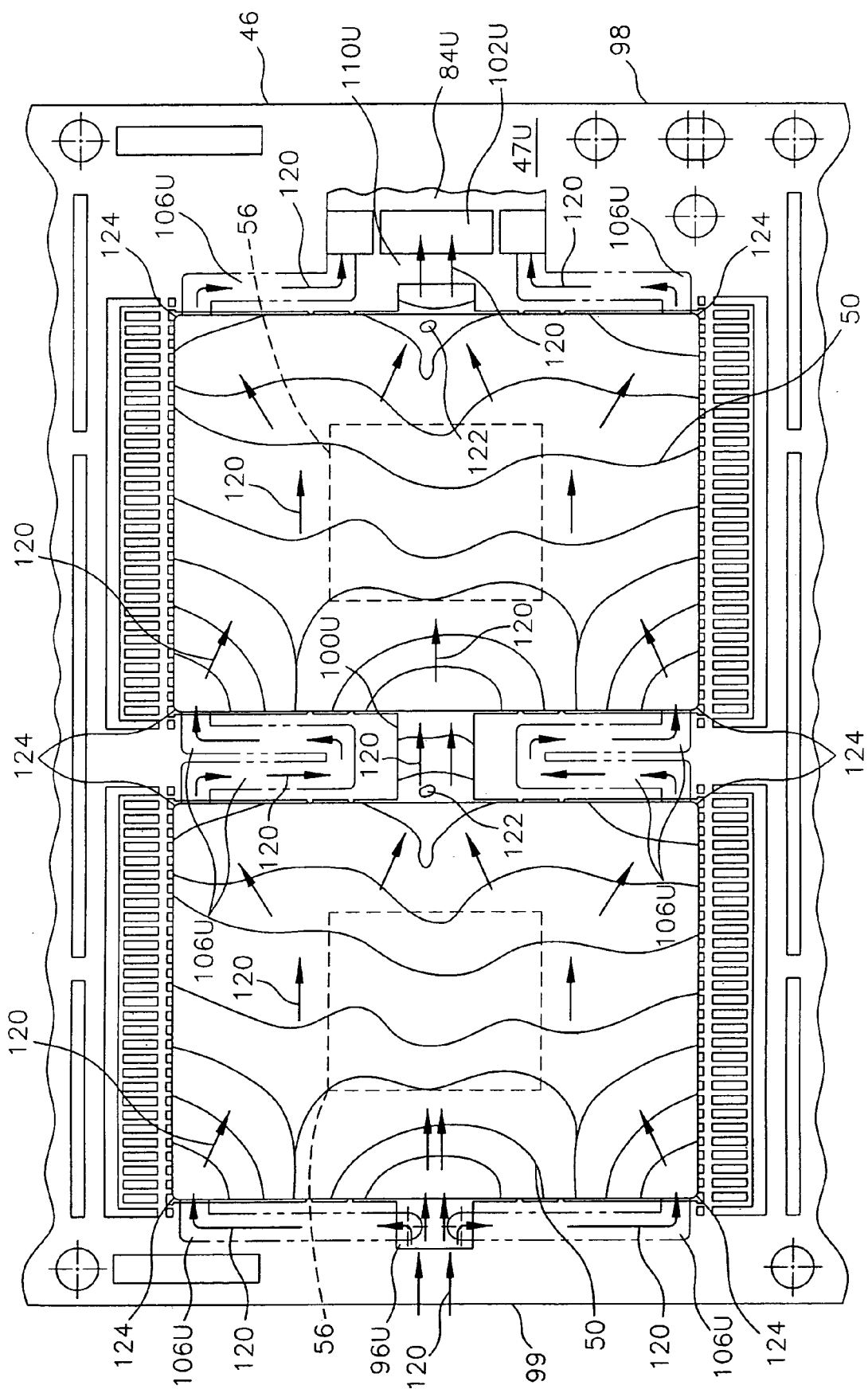
FIG. 6 is a cross sectional view taken along section line 6—6 of FIG. 2C illustrating a flow of a molding compound on an upper surface of the leadframe during a molding step.

Referring to FIG. 6, the flow of the molding compound 50 over the upper surface 47U of the leadframe 46 during the molding step is illustrated. As indicated by flow arrows 120, the molding compound 50 enters the inlet runners 96U and is directed into the upper mold cavities 86U (FIG. 3C). In general, the flow of the molding compound 50 is from left to right in FIG. 6, from the left lateral edge 99 of the leadframe 46 towards the right lateral edge 98 of the leadframe 46. However, as is apparent the "right" and "left" terminology is for illustrative purposes, and would change according to the orientation of the leadframe 46. Accordingly the claims to follow refer generically to a "first edge" (i.e., left lateral edge 99) and to a "second edge" (i.e., right lateral edge 98).

The corner runners 106U also direct the molding compound 50 proximate to the corners 108U (FIG. 3C) of the upper mold cavities 86U such that the corners 124 of the packages 52 do not include voids and trapped air 120. Each corner 124 includes orthogonal surfaces such that the corner runners 106U direct the flow of the molding compound 50 through the corner 124 in a direction generally perpendicular to one corner surface and generally parallel to the other corner surface. With the corner runners 106U directing the flow of the molding compound through the corners 124, there is no need to vent the corners 108U (FIG. 3C) of the upper mold cavities 86U.

In the illustrative embodiment the corner runners 106 are configured to initially direct the molding compound 50 along outside edges of the upper mold cavities 86U on the left lateral edge 99 of the leadframe 46 in a flow direction generally perpendicular to the flow of the molding compound through the inlet runners 96U. In addition, the corner runners 106U are configured to turn the flow direction of the molding compound approximately 90° such that the molding compound 50 enters the corners 108U of the upper mold cavities 86U on the left lateral edge 99 of the leadframe 46 in a flow direction that is generally parallel to the flow direction through the inlet runners 96U.

The molding compound 50 is also directed through the connecting runners 100U into the adjacent mold cavities 86U. The flow direction through the connecting runners 100U is generally parallel to the flow direction through the inlet runners 96U. The corner runners 106U are configured to turn the molding compound 50 exiting the upper mold cavities 86U on the left lateral edge 99 of the leadframe 46 approximately 90° and towards the connecting runners 100U, then 180° and away from the connecting runners 100U.

The molding compound 50 is also directed through the dummy runners 110U and into the dummy mold cavity 102U. Any trapped air 122 is also directed into the dummy mold cavity 102U and is vented through the air vent 84U to atmosphere. The corner runners 106U are configured to turn the molding compound 50 exiting the upper mold cavities 86U on the right lateral edge 99 of the leadframe 46 approximately 90°, and to direct the molding compound towards the dummy runners 110U. The corner runners 106U then turn the flow of the molding compound approximately 90° in a direction generally parallel to the flow direction through the dummy runners 110U and the dummy mold cavities 102U.

The flow of the molding compound over the lower surface 47L (FIG. 2C) of the leadframe 46 is substantially the same as described above, except the connecting dummy segment 78 (FIG. 2C) and the second lower dummy segment 118 (FIG. 2C) are also formed and function as package to package runners.

Thus the invention provides a system and a method for fabricating semiconductor components, and improved semiconductor components fabricated using the system and the method. While the invention has been described with reference to certain preferred embodiments, as will be apparent to those skilled in the art, certain changes and modifications can be made without departing from the scope of the invention as defined by the following claims.

What is claimed is:

1. A method for fabricating semiconductor components on a substrate comprising:
   providing a plate comprising at least one cavity configured to receive a molding compound and to mold a body segment of a component on the substrate, the cavity having at least one corner;
   providing at least one corner runner on the plate configured to direct the molding compound through the corner;
   providing at least one dummy cavity on the plate in flow communication with the cavity and the corner runner;
   providing a vent on the plate in flow communication with the dummy cavity;
   injecting the molding compound into the cavity and the dummy cavity; and
   venting the air through the vent during the injecting step.

2. A method for fabricating semiconductor components on a substrate comprising:
   providing a plate comprising a plurality of cavities configured to receive a molding compound and to mold body segments of the components on a surface of the substrate, the cavities having a plurality of corners;
   providing a plurality of corner runners on the plate configured to direct the molding compound through the corners and to prevent air from accumulating in the corners;
   providing a vent on the plate in flow communication with the cavities and the corner runners;
   providing a dummy cavity on the plate in flow communication with the corner runners and the vent;
   injecting the molding compound into the cavities and molding the body segments on the surface;
   collecting the air in the dummy cavity; and
   venting the air through the vent.

3. A method for fabricating semiconductor components on a substrate comprising:
   providing a plate comprising a plurality of cavities configured to receive a molding compound and to mold body segments of the components on a surface of the substrate, the cavities having a plurality of corners having orthogonal surfaces;
   providing a plurality of corner runners on the plate configured to direct the molding compound generally parallel to and generally perpendicular to the orthogonal surfaces to prevent air from accumulating in the corners;
   providing a vent on the plate in flow communication with the cavities and the corner runners;
   injecting the molding compound into the cavities and molding the body segments on the surface; and
   venting the air through the vent during the injecting step.

4. The method of claim 3 wherein the substrate comprises a leadframe and the components comprise semiconductor packages.

5. A method for fabricating a semiconductor component on a substrate comprising:
   providing a plate comprising a cavity configured to receive a molding compound and to mold a body segment of the component on the substrate, the cavity having a corner;
   providing a first runner on the plate configured to direct the molding compound through the corner and to prevent trapped air in the molding compound from accumulating in the corner;
   providing a second runner on the plate in flow communication with the first runner, the first runner and the second runner configured to change a flow direction of the molding compound;
   providing an air vent on the plate in flow communication with the second runner; and
   molding the body segment to the substrate using the cavity with the first runner directing the molding compound through the corner and the second runner directing the trapped air to the air vent.

6. A method for fabricating a semiconductor component on a substrate comprising:
   providing a plate comprising a cavity configured to receive a molding compound and to mold a body segment of the component on the substrate, the cavity having a corner;
   providing a dummy cavity on the plate in flow communication with the cavity and the air vent configured to mold a dummy segment on the substrate;
   providing a runner on the plate configured to direct the molding compound through the corner and to prevent trapped air in the molding compound from accumulating in the corner;
   providing an air vent on the plate in flow communication with the runner;
   molding the body segment to the substrate using the cavity with the runner directing the molding compound through the corner and the trapped air to the air vent and with the air vent venting the trapped air; and
   molding the dummy segment during the molding step.

7. The method of claim 6 further comprising providing a second cavity on the plate in flow communication with the air vent, the cavity and a second runner configured to direct the molding compound through a second corner of the second cavity, then molding a second body segment for a second component on the substrate using the second cavity and the second runner.

8. The method of claim 6 wherein the substrate comprises a leadframe and the component comprises a semiconductor package.

9. A method for fabricating a semiconductor component on a substrate comprising:
   providing a plate comprising a cavity configured to mold a body segment for the component on a surface of the substrate and having a corner;
   providing an inlet runner on the plate configured to direct a molding compound into the cavity;
   providing a corner runner on the plate configured to direct the molding compound through the corner and to prevent trapped air in the molding compound from accumulating in the corner;
   providing a dummy cavity on the plate configured to mold a dummy segment on the substrate;
   providing an air vent on the substrate in flow communication with the dummy cavity; and
   molding the body segment and the dummy segment on the substrate using the cavity with the corner runner directing the trapped air into the dummy cavity and the air vent venting the trapped air.

10. The method of claim 9 wherein the substrate comprises a leadframe and the component comprises a semiconductor package.

11. The method of claim 9 further comprising providing a pair of mold cavities on the plate configured to mold body segments on the substrate for a pair of components, providing a second corner runner configured to direct the molding compound through a second corner of the second cavity, providing a connecting runner configured to direct the molding compound between the pair of mold cavities, then molding the body segments while directing the molding compound through the second corner into the dummy cavity and venting the trapped air through the air vent.

12. The method of claim 9 wherein the corner includes orthogonal surfaces and the corner runner is configured to direction the molding compound generally parallel to one surface and generally perpendicular to another surface.

13. The method of claim 9 wherein the component comprises a semiconductor package comprising a die and the body segment encapsulates the die.

14. The method of claim 9 further comprising providing a second plate substantially identical to the plate configured to mold an opposing body segment for the component on an opposing surface of the substrate then molding the opposing body segment during the molding step.

15. The method of claim 9 further comprising providing a plurality of cavities on the plate configured to mold a plurality of body segments for a plurality of components on the substrate, the cavities having a plurality of corners and a plurality of corner runners configured to direct the molding compound through the corners then molding the body segments during the molding step.

16. The method of claim 9 wherein the plate is mounted to a transfer molding apparatus and the molding step is performed using the transfer molding apparatus.

17. A method for fabricating semiconductor components comprising:
providing a substrate;
providing a first plate comprising a plurality of first mold cavities configured to mold first body segments for the components on the substrate;
providing a first runner on the first plate configured to direct a molding compound into the first cavities;
providing a plurality of first corner runners on the first plate configured to direct the molding compound through first corners in the first cavities and to prevent air in the molding compound from accumulating in the first corners;
providing a vent on the first plate in flow communication with the first runner and the first corner runners; and
molding the first body segments to the substrate using the first cavities with the first runner and the first corner runners directing the molding compound through the first cavities, and with the air venting through the air vent.

18. The method of claim 17 further comprising:
providing a second plate comprising a plurality of second mold cavities configured to mold second body segments for the components on the substrate;
providing a second runner on the second plate configured to direct the molding compound into the second cavities;
providing a plurality of second corner runners on the second plate configured to direct the molding compound through second corners in the second cavities and to prevent the air in the molding compound from accumulating in the second corners;
providing a second vent on the second plate in flow communication with the second runner and the second corner runners; and
molding the second body segments to the substrate using the second cavities with the second runner and the second corner runners directing the molding compound through the second cavities, and with the air venting through the air vent.

19. The method of claim 18 further comprising providing the substrate with a plurality of openings configured to direct the molding compound on opposing sides of the substrate.

20. The method of claim 18 wherein the substrate comprises a leadframe and the components comprise semiconductor packages.

* * * * *

UNITED STATES PATENT AND TRADEMARK OFFICE
CERTIFICATE OF CORRECTION

| | | |
|---|---|---|
| PATENT NO. | : 7,186,589 B2 | |
| APPLICATION NO. | : 10/949612 | |
| DATED | : March 6, 2007 | |
| INVENTOR(S) | : Stephen L. James | |

It is certified that error appears in the above-identified patent and that said Letters Patent is hereby corrected as shown below:

Title page,
Item (75), Inventors, change "Steven L. James" to --Stephen L. James--.

Signed and Sealed this

First Day of May, 2007

JON W. DUDAS
*Director of the United States Patent and Trademark Office*